United States Patent
Matsutani et al.

(10) Patent No.: US 9,393,721 B2
(45) Date of Patent: Jul. 19, 2016

(54) METHOD FOR PRODUCING THREE-LAYER CO-EXTRUDED POLYIMIDE FILM

(75) Inventors: Teruo Matsutani, Shiga (JP); Yasutaka Kondo, Shiga (JP); Hisayasu Kaneshiro, Shiga (JP)

(73) Assignee: KANEKA CORPORATION, Osaka (JP)

( * ) Notice: Subject to any disclaimer, the term of this patent is extended or adjusted under 35 U.S.C. 154(b) by 191 days.

(21) Appl. No.: 13/993,624

(22) PCT Filed: Dec. 7, 2011

(86) PCT No.: PCT/JP2011/078340
§ 371 (c)(1),
(2), (4) Date: Jun. 12, 2013

(87) PCT Pub. No.: WO2012/081478
PCT Pub. Date: Jun. 21, 2012

(65) Prior Publication Data
US 2013/0256943 A1    Oct. 3, 2013

(30) Foreign Application Priority Data

Dec. 14, 2010  (JP) ................. 2010-278587

(51) Int. Cl.
| | | |
|---|---|---|
| B29C 41/32 | (2006.01) | |
| C08L 79/08 | (2006.01) | |
| B32B 27/28 | (2006.01) | |
| C08G 73/10 | (2006.01) | |
| B29C 47/06 | (2006.01) | |
| B29K 79/00 | (2006.01) | |
| H05K 1/03 | (2006.01) | |
| B29C 47/00 | (2006.01) | |

(52) U.S. Cl.
CPC ............ *B29C 41/32* (2013.01); *B32B 27/281* (2013.01); *C08G 73/105* (2013.01); *C08G 73/1042* (2013.01); *C08G 73/1067* (2013.01); *C08G 73/1071* (2013.01); *C08L 79/08* (2013.01); *B29C 47/0021* (2013.01); *B29C 47/065* (2013.01); *B29K 2079/08* (2013.01); *B29K 2079/085* (2013.01); *B32B 2250/03* (2013.01); *B32B 2250/24* (2013.01); *H05K 1/036* (2013.01); *H05K 1/0393* (2013.01); *H05K 2201/0154* (2013.01)

(58) Field of Classification Search
CPC ..................................... B29C 41/32
See application file for complete search history.

(56) References Cited

U.S. PATENT DOCUMENTS

| | | | |
|---|---|---|---|
| 7,678,315 B2 | 3/2010 | Yanagida et al. | |
| 8,124,241 B2 | 2/2012 | Yanagida et al. | |
| 2007/0158869 A1 | 7/2007 | Yanagida et al. | |
| 2007/0179271 A1* | 8/2007 | Kaneshiro et al. | ............ 528/310 |
| 2009/0104465 A1 | 4/2009 | Yanagida et al. | |
| 2012/0308816 A1* | 12/2012 | Kohama ................. | B32B 15/08 |
| | | | 428/354 |

FOREIGN PATENT DOCUMENTS

| | | |
|---|---|---|
| EP | 0659553 | 6/1995 |
| JP | H07-214637 | 8/1995 |
| JP | H09-116254 | 5/1997 |
| JP | H10-138318 | 5/1998 |
| JP | 2006-110772 | 4/2006 |
| JP | 2007-290256 | 11/2007 |
| JP | 2008-188778 | 8/2008 |
| JP | 2008-188843 | 8/2008 |
| WO | 2005/111165 | 11/2005 |
| WO | 2007/099801 | 9/2007 |

OTHER PUBLICATIONS

International Preliminary Report on Patentability, PCT/JP2011/078340.
PCT International Search Report and Written Opinion, PCT/JP2011/078340, 8 pgs.

* cited by examiner

*Primary Examiner* — Ryan Ochylski
(74) *Attorney, Agent, or Firm* — Kagan Binder, PLLC

(57) ABSTRACT

In the present invention, (i) a polyamic acid solution for forming a thermoplastic polyimide layer to be in no contact with a support contains no chemical dehydrating agent or imidization catalyst, (ii) a polyamic acid solution for forming a thermoplastic polyimide layer to be in contact with the support contains an imidization catalyst, and (iii) a polyamic acid solution for forming a non-thermoplastic polyimide layer contains a chemical dehydrating agent and an imidization catalyst. This arrangement eliminates a property difference between the thermoplastic polyimide layers.

10 Claims, No Drawings

METHOD FOR PRODUCING THREE-LAYER CO-EXTRUDED POLYIMIDE FILM

This application claims benefit from International Application No. PCT/JP2011/078340, which was filed on Dec. 7, 2011, which in turn claims priority to Japanese Application No. 2010-278587, which was filed on Dec. 14, 2010, wherein the entireties of said patent applications are incorporated herein by reference.

TECHNICAL FIELD

The present invention relates to a method for producing a three-layer coextrusion polyimide film which can be suitably used for a flexible printed wiring board.

BACKGROUND ART

In recent years, there has been a growing demand for various printed boards along with a reduction in weight, a reduction in size, and an increase in density of electronics products. In particular, there has been a rapidly growing demand for flexible laminates (herein also referred to as "flexible printed wiring boards (for FPCs)"). A flexible laminate is structured to include, on an insulating film such as a polyimide film, a circuit made of a metal layer.

The flexible printed wiring board is made originally from a flexible metal-clad laminate. In general, a flexible metal-clad laminate is produced by a method which uses, as a substrate, a flexible insulating film made of various insulating materials and that bonds a metal foil onto a surface of the substrate via various adhesive materials by heating and pressure bonding. As the insulating film, a polyimide film or the like is preferably used. As the adhesive material, a thermosetting adhesive such as an epoxy adhesive or an acrylic adhesive is generally used. A thermosetting adhesive has an advantage of allowing for adhesion at a comparatively low temperature. However, along with stricter requirements for properties such as heat resistance, bendability, and electric reliability, fabricating a three-layer FPC with use of a thermosetting adhesive is expected to involve difficulty in satisfying these requirements. For this reason, a two-layer FPC has been proposed which is obtained by providing a metal layer directly on an insulating film or whose adhesive layer is made of a thermoplastic polyimide. Such two-layer FPCs are superior in property to three-layer FPCs, and are thus expected to experience an increase in demand in the future.

An example method for producing a three-layer polyimide film for a two-layer FPC is a method of applying a polyamic acid solution to a surface of a polyimide film and drying (imidizing) the applied solution to produce a three-layer polyimide film. Such a method, however, requires a step of producing a polyimide film and a step of applying a polyamic acid solution to a surface of the polyimide film and drying (imidizing) the applied solution. The above method thus involves more than one step, and costs can be increased as a result (see, for example, Patent Literature 1).

Another example method for producing a three-layer polyimide film for a two-layer FPC is a method of cast-flowing polyamic acid solutions in a plurality of layers simultaneously onto a support, drying the cast-flown solutions, removing the dried product from the support, and heat-treating the removed product to produce a three-layer polyimide film. Such a method can, however, pose problems that (i) a polyimide layer in direct contact with the support is adhered to the support partially and (ii) there is a difference in peel strength between a polyimide layer in contact with the support and a polyimide layer present oppositely from the above polyimide layer (see, for example, Patent Literatures 2 and 3).

Citation List

Patent Literature 1
Japanese Patent Application Publication, Tokukaihei, No. 9-116254 A (Publication Date: May 2, 1997)
Patent Literature 2
Japanese Patent Application Publication, Tokukaihei, No. 7-214637 A (Publication Date: Aug. 15, 1995)
Patent Literature 3
Japanese Patent Application Publication, Tokukaihei, No. 10-138318 A (Publication Date: May 26, 1998)

SUMMARY OF INVENTION

Technical Problem

The present invention has been accomplished in view of the above problems. It is an object of the present invention to provide a method for producing a three-layer coextrusion polyimide film which method allows three-layer coextrusion to cast-flow polyamic acid solutions onto a support with causing no property difference between two polyimide layers of a three-layer polyimide film, one of which polyimide layers is in direct contact with the support and the other of which polyimide layers is located on an opposite side with respect to the support.

Solution to Problem

The inventors of the present invention have diligently studied the above problems, and thus arrived at the present invention.

The present invention relates to a method for producing a three-layer coextrusion polyimide film by cast-flowing polyamic acid solutions onto a support by three-layer coextrusion, the three-layer coextrusion polyimide film including, in lamination, a non-thermoplastic polyimide layer and thermoplastic polyimide layers provided on respective surfaces of the non-thermoplastic polyimide layer, wherein: among the polyamic acid solutions, a polyamic acid solution for forming a thermoplastic polyimide layer to be in no direct contact with the support does not contain a chemical dehydrating agent and an imidization catalyst, a polyamic acid solution for forming a thermoplastic polyimide layer to be in direct contact with the support contains an/the imidization catalyst, and a polyamic acid solution for forming the non-thermoplastic polyimide layer contains a/the chemical dehydrating agent and an/the imidization catalyst.

Advantageous Effects of Invention

The present invention can provide a method for producing a three-layer coextrusion polyimide film which method, when polyamic acid solutions are cast-flown onto a support by three-layer coextrusion, causes no property difference between (i) a polyimide layer of a three-layer polyimide film which polyimide layer is in direct contact with the support and (ii) a polyimide layer of the three-layer polyimide film which polyimide layer is present oppositely from the above polyimide layer.

The present invention can provide a method for producing a three-layer coextrusion polyimide film which method, when a polyimide film is peeled off from a support, leaves no fragments (peeling residues) of thermoplastic polyimide layers on the support.

DESCRIPTION OF EMBODIMENTS

An embodiment of the present invention is described below.

The present invention relates to a method for producing a three-layer coextrusion polyimide film by cast-flowing polyamic acid solutions onto a support by three-layer coextrusion, the three-layer coextrusion polyimide film including, in lamination, a non-thermoplastic polyimide layer and thermoplastic polyimide layers provided on respective surfaces of the non-thermoplastic polyimide layer, wherein: among the polyamic acid solutions, a polyamic acid solution for forming a thermoplastic polyimide layer to be in no direct contact with the support does not contain a chemical dehydrating agent and an imidization catalyst, a polyamic acid solution for forming a thermoplastic polyimide layer to be in direct contact with the support contains an/the imidization catalyst, and a polyamic acid solution for forming the non-thermoplastic polyimide layer contains a/the chemical dehydrating agent and an/the imidization catalyst.

The term "non-thermoplastic polyimide" in the present invention generally denotes a polyimide which does not soften or become adhesive on heating. In the present invention, the non-thermoplastic polyimide denotes (i) a polyimide a film made solely of which can keep its shape without being wrinkled or stretched even after being heated at 450° C. for 1 minute, or (ii) a polyimide having substantially no glass transition temperature in DSC (differential scanning calorimetry).

Further, the term "thermoplastic polyimide" in the present invention generally denotes a polyimide having a glass transition temperature in DSC (differential scanning calorimetry) measurement. The term "thermoplastic polyimide" in the present invention denotes a thermoplastic polyimide whose glass transition temperature ranges from 150° C. to 350° C.

Examples of an aromatic acid dianhydride which is used in the non-thermoplastic polyimide layer of the three-layer polyimide film include, but are not particularly limited to, pyromellitic acid dianhydride, 2,3,6,7-naphthalenetetracarboxylic acid dianhydride, 3,3',4,4'-biphenyltetracarboxylic acid dianhydride, 1,2,5,6-naphthalenetetracarboxylic acid dianhydride, 2,2',3,3'-biphenyltetracarboxylic acid dianhydride, 3,3',4,4'-benzophenonetetracarboxylic acid dianhydride, 2,2-bis(3,4-dicarboxyphenyl)propane dianhydride, 3,4,9,10-perylenetetracarboxylic acid dianhydride, bis(3,4-dicarboxyphenyl) propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic acid dianhydride, bis(3,4-dicarboxyphenyl) sulfone dianhydride, p-phenylene bis(trimellitic acid monoester acid anhydride), ethylene bis(trimellitic acid monoester acid anhydride), bisphenol A bis(trimellitic acid monoester acid anhydride), and derivatives thereof. These aromatic acid dianhydrides can be favorably used alone or in the form of a mixture thereof with a given ratio.

The aromatic acid dianhydride is, among the above examples, preferably at least one type of acid dianhydride selected from the group consisting of pyromellitic acid dianhydride, 3,3',4,4'-biphenyltetracarboxylic acid dianhydride, and 3,3',4,4'-benzophenonetetracarboxylic acid dianhydride. Among these, pyromellitic acid dianhydride and 3,3',4,4'-benzophenonetetracarboxylic acid dianhydride are more preferable in terms of solvent solubility during production.

Examples of an aromatic diamine which is used in the non-thermoplastic polyimide layer of the three-layer polyimide film include, but are not particularly limited to, 2,2-bis[4-(4-aminophenoxy)phenyl]propane, 4,4'-diamino diphenyl ether, 3,4'-diaminodiphenylether, 1,3-bis(4-aminophenoxy)benzene, 1,4-bis(4-aminophenoxy)benzene, p-phenylenediamine, 4,4'-diaminodiphenyl propane, 4,4'-diaminodiphenyl methane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diamino diphenyl ether, 3,3'-diaminodiphenyl ether, 3,4'-diaminodiphenylether, 1,5-diamino naphthalene, 4,4'-diaminodiphenyldiethylsilane, 4,4'-diaminodiphenyl silane, 4,4'-diaminodiphenylethyl phosphine oxide, 4,4'-diaminodiphenyl N-methyl amine, 4,4'-diaminodiphenyl N-phenylamine, 1,4-diaminobenzene(p-phenylenediamine), 1,3-diaminobenzene, 1,2-diaminobenzene, 2,2-bis[4-(4-aminophenoxy)phenyl]propane, and derivatives thereof. These aromatic diamines can be favorably used alone or in the form of a mixture thereof with a given ratio.

The diamine included in the non-thermoplastic polyimide is, among the above examples, preferably (i) 2,2-bis[4-(4-aminophenoxy)phenyl]propane in terms of formation of a thermoplastic block or (ii) p-phenylenediamine or 4,4'-diamino diphenyl ether in terms of control of linear expansion coefficient and strength.

A polyamic acid that forms the non-thermoplastic polyimide layer preferably contains a thermoplastic block component in its molecule. This is because such a polyamic acid can improve adhesion between the non-thermoplastic polyimide and the thermoplastic polyimide.

Examples of an aromatic acid dianhydride which is used in the thermoplastic polyimide layers of the three-layer polyimide film include, but are not particularly limited to, pyromellitic acid dianhydride, 2,3,6,7-naphthalene tetracarboxylic acid dianhydride, 3,3',4,4'-biphenyltetracarboxylic acid dianhydride, 1,2,5,6-naphthalene tetracarboxylic acid dianhydride, 2,2',3,3'-biphenyl tetracarboxylic acid dianhydride, 3,3',4,4'-benzophenonetetracarboxylic acid dianhydride, 2,2-bis(3,4-dicarboxyphenyl)propane dianhydride, 3,4,9,10-perylene tetracarboxylic acid dianhydride, bis(3,4-dicarboxyphenyl)propane dianhydride, 1,1-bis(2,3-dicarboxyphenyl) ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic acid dianhydride, bis(3,4-dicarboxyphenyl)sulfonic dianhydride, p-phenylene bis(trimellitic acid monoester anhydride), ethylene bis(trimellitic acid monoester anhydride), bisphenol A bis(trimellitic acid monoester anhydride), and derivatives thereof. These aromatic acid dianhydrides can be favorably used alone or in the form of a mixture thereof with a given ratio.

The aromatic acid dianhydride is, among the above examples, preferably at least one type of acid dianhydride selected from the group consisting of pyromellitic acid dianhydride, 3,3',4,4'-biphenyltetracarboxylic acid dianhydride, and 3,3',4,4'-benzophenonetetracarboxylic acid dianhydride. The aromatic acid dianhydride is preferably 3,3',4,4'-biphenyltetracarboxylic acid dianhydride for an increase in peel strength of a copper foil of a flexible metal-clad laminate. The aromatic acid dianhydride is preferably a combination of pyromellitic acid dianhydride and 3,3',4,4'-biphenyltetracarboxylic acid dianhydride for both an increase in peel strength of a copper foil of the flexible metal-clad laminate and an improvement in soldering heat resistance.

Examples of an aromatic diamine that is used in the thermoplastic polyimide layers of the three-layer polyimide film include, but are not particularly limited to, 2,2-bis[4-(4-aminophenoxy)phenyl]propane, 4,4'-diamino diphenyl ether, 3,4'-diaminodiphenylether, 1,3-bis(4-aminophenoxy)benzene, 1,4-bis(4-aminophenoxy)benzene, p-phenylenediamine, 4,4'-diaminodiphenyl propane, 4,4'-diaminodiphenyl methane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diamino diphenyl ether, 3,3'-diaminodiphenyl ether, 3,4'-diaminodiphenylether, 1,5-diamino naphthalene, 4,4'-diaminodiphenyldiethylsilane, 4,4'-diaminodiphenyl silane, 4,4'-diaminodiphenylethyl phosphine oxide, 4,4'-diaminodiphenyl N-methyl amine, 4,4'-diaminodiphenyl N-phenylamine, 1,4-diaminobenzene(p-phenylenediamine), 1,3-diaminobenzene, 1,2-diaminobenzene, 2,2-bis[4-(4-aminophenoxy)phenyl]propane, and derivatives thereof. These aromatic diamines can be favorably used alone or in the form of a mixture thereof with a given ratio.

Among the above examples, 2,2-bis[4-(4-aminophenoxy) phenyl]propane included in the thermoplastic polyimide is preferable because it improves peel strength of a metal foil of a metal foil-clad laminate.

A three-layer polyimide film includes a non-thermoplastic polyimide layer and thermoplastic polyimide layers formed on both surfaces of the non-thermoplastic polyimide layer, and allows for production of a both-surface metal-clad laminate. A three-layer polyimide film is preferable in that it allows a reduction in weight, a reduction in size, and an increase in circuit density of a flexible printed wiring board.

A three-layer polyimide film is produced by a method of cast-flowing three layers of polyamic acid simultaneously onto a support by three-layer coextrusion to produce a three-layer polyimide film. During the production, a polyamic acid solution for forming a thermoplastic polyimide layer to be in direct contact with the support contains an imidization catalyst, whereas a non-thermoplastic polyimide layer contains a chemical dehydrating agent and an imidization catalyst. With this arrangement, the polyamic acid in direct contact with the support proceeds in imidization and expresses a self-supporting property, and the resulting film becomes higher in strength. Thus, with the above arrangement, partial adherence to the support is reduced, so that a three-layer gel film can be peeled off. Further, the progress of the imidization reaction causes a solvent to exude due to a difference, between the polyamic acid and the polyimide, in solubility in the solvent. As a result, a three-layer gel film can be easy to peel off from the support. For these reasons, the polyamic acid solution to be in direct contact with the support further preferably contains a chemical dehydrating agent and an imidization catalyst.

The thermoplastic polyimide layer in no contact with the support does not need to contain a chemical dehydrating agent and an imidization catalyst because the chemical dehydrating agent and imidization catalyst contained in the thermoplastic polyimide layer in direct contact with the support and the non-thermoplastic polyimide layer pass, on heating, through the thermoplastic polyimide layer in no contact with the support. The thermoplastic polyimide layer in no contact with the support preferably contains no chemical dehydrating agent or imidization catalyst in terms of cost.

The thermoplastic polyimide layer in no contact with the support preferably contains no chemical dehydrating agent or imidization catalyst to reduce a property difference between (i) the thermoplastic polyimide layer in direct contact with the support and (ii) the thermoplastic polyimide layer in no contact with the support.

The description below deals with benefits achieved by the feature in which an imidization catalyst is contained in the polyamic acid solution for forming a thermoplastic polyimide layer to be in direct contact with the support.

The chemical dehydrating agent and imidization catalyst contained in the polyamic acid solution for forming a non-thermoplastic polyimide layer tend to exude from surfaces of the film on heating. However, the presence of the support allows only a small space for the chemical dehydrating agent and imidization catalyst to exude from the surface on a side of a thermoplastic polyimide layer (hereinafter referred to as "thermoplastic side B") in direct contact with the support. Thus, the chemical dehydrating agent and imidization catalyst tend to exude mainly from the surface on a side of a thermoplastic polyimide layer (hereinafter referred to as "thermoplastic side A") in no contact with the support. As a result of this, respective unreacted portions of the chemical dehydrating agent and the imidization catalyst, which are left unreacted in the non-thermoplastic polyimide layer, cause an imidization reaction to progress more on the thermoplastic side A than on the thermoplastic side B. As a result, there occurs a difference in degree of progress of an imidization reaction between the thermoplastic side B and the thermoplastic side A. The inventors of the present invention believe that this difference is a cause of the property difference between the thermoplastic side A and thermoplastic side B of a three-layer polyimide film. It is effective to add an imidization catalyst in the thermoplastic polyimide layer of the thermoplastic side B so as to compensate for the difference in degree of progress of an imidization reaction.

If the polyamic acid solution for forming a thermoplastic polyimide layer of the thermoplastic side B contains no imidization catalyst, there may occur a difference, between the thermoplastic side A and the thermoplastic side B, in (i) whether or not layer peeling occurs or (ii) peel strength of a metal foil therefrom. In the case where the polyamic acid solution for a thermoplastic polyimide layer of the thermoplastic side B contains an imidization catalyst, there is a smaller property difference between the thermoplastic side A and the thermoplastic side B. Further, in the case where the imidization catalyst and the chemical dehydrating agent are used in combination with each other, it is possible to reduce the property difference between the thermoplastic side A and the thermoplastic side B more efficiently.

The three-layer polyimide film is produced by a method of (i) cast-flowing three-layer polyamic acid solutions simultaneously onto a support by three-layer coextrusion each in a form of a three-layer thin film, (ii) heating the cast-flown solutions on the support, (iii) peeling the resulting three-layer gel film off from the support, and (iv) heating the gel film at a high temperature of 200° C. or higher to produce a three-layer polyimide film.

The three-layer polyamic acid solutions are such that, on each surface of a layer of the polyamic acid solution for forming a non-thermoplastic polyimide layer, a layer of the polyamic acid solution for forming a thermoplastic polyimide layer is formed. The polyamic acid solution for forming a non-thermoplastic layer contains a chemical dehydrating agent and an imidization catalyst. The polyamic acid solution for forming the thermoplastic side A contains no chemical dehydrating agent or imidization catalyst, whereas the polyamic acid solution for forming the thermoplastic side B contains an imidization catalyst. The polyamic acid solution for forming the thermoplastic side B can contain both an imidization catalyst and a chemical dehydrating agent in combination with each other. In the case where the polyamic acid solution for forming the thermoplastic side B contains an imidization catalyst, the polyamic acid in direct contact with the support progresses in imidization reaction and expresses a self-supporting property, and the resulting film becomes higher in strength. As a result, partial adherence to the support is reduced, and a multilayer gel film can be peeled off without leaving peeling residues on the support. Further, the progress of the imidization reaction causes a solvent to exude due to a difference, between the polyamic acid and the polyimide, in solubility in the solvent. As a result, a multilayer gel film can be peeled off easily from the support. For this reason, it is effective for the polyamic acid solution for forming the thermoplastic side B to contain an imidization catalyst.

A multilayer gel film can be prepared by (i) cast-flowing, onto a support, polyamic acid solutions for thermoplastic polyimide layers by multilayer coextrusion and (ii) drying the polyamic acid solutions on the support. Such a multilayer gel film, even if polyamic acid solutions are dried on a support at a temperature lower than a glass transition temperature of the thermoplastic polyimide, (i) has a decreased glass transition temperature if there partially remains a polyamic acid backbone, and (ii) becomes softened easily depending on an amount of a solvent remaining in the multilayer gel film. Thus, even if the polyamic acid solutions are simply dried on the support, the multilayer gel film at least partially fails to express a strength which allows the multilayer gel film to be tolerant of being peeled off from the support. As a result, the multilayer gel film of the thermoplastic polyimide would partially remain adhered to the support. On the other hand, in the case where polyamic acid solutions for thermoplastic polyimide layers is in direct contact with a support, a multilayer gel film can express a strength by containing an imidization catalyst in the polyamic acid solutions for thermoplastic polyimide layers. With this arrangement, it is possible to reduce cases where the multilayer gel film remains adhered to the support when the multilayer gel film is peeled off from the support. Further, in the case where the imidization catalyst is used in combination with a chemical dehydrating agent, the imidization reaction tends to progress more, and consequently the strength of the multilayer gel film is increased more.

The phrase "60% or more of a total number of moles of an acid dianhydride monomer and a diamine monomer which constitute a polyamic acid that forms the thermoplastic polyimide layers is identical to an acid dianhydride monomer and a diamine monomer which constitute a polyamic acid that forms the non-thermoplastic polyimide layer" refers to the following: With reference to a total number of moles (gross number of moles) of an acid dianhydride monomer and a diamine monomer which constitute a polyamic acid that forms the thermoplastic polyimide layers, 60% or more of the total number of moles is of monomers identical to an acid dianhydride monomer and a diamine monomer which constitute a polyamic acid that forms the non-thermoplastic polyimide layer. The above value is calculated by the following formula: (number of moles of an identical type)/(gross number of moles).

In the case where 60% or more of the total number of moles of the acid dianhydride monomer(s) and the diamine monomer(s) which constitute the polyamic acid that forms the thermoplastic polyimide layers is identical to the acid dianhydride monomer(s) and the diamine monomer(s) which constitute the polyamic acid that forms the non-thermoplastic polyimide layer, the thermoplastic polyimide layer of a three-layer gel film tends less to adhere to the support. The above value is preferably (i) 70% or more, or more preferably (ii) 80% or more.

The polyamic acid solution for the thermoplastic side B contains the imidization catalyst in such an amount that the imidization catalyst is preferably (i) 0.05 to 2.0 mol, more preferably (ii) 0.05 to 1.0 mol, or particularly preferably (iii) 0.1 to 0.8 mol per 1 mol of an amide acid unit in a polyamic acid contained in a solution in which an imidization catalyst is to be added.

In the case where the imidization catalyst is used in combination with a chemical dehydrating agent, the chemical dehydrating agent is contained in an amount that the chemical dehydrating agent is preferably (i) 0.5 to 4.5 mol, or (ii) more preferably 1.0 to 4.0 mol per 1 mol of an amide acid unit in a polyamic acid contained in a solution in which the chemical dehydrating agent and the imidization catalyst are to be added.

The polyamic acid solution for the non-thermoplastic polyimide layer contains a chemical dehydrating agent and an imidization catalyst. The chemical dehydrating agent is contained in an amount that the chemical dehydrating agent is preferably (i) 0.5 to 4.5 mol, or more preferably (ii) 1.0 to 4.0 mol per 1 mol of an amide acid unit in a polyamic acid contained in the solution in which the chemical dehydrating agent and the imidization catalyst are to be added. The imidization catalyst is contained in an amount that the imidization catalyst is preferably (i) 0.05 to 2.0 mol, more preferably (ii) 0.05 to 1.0 mol, or particularly preferably (iii) 0.1 to 0.8 mol per 1 mol of an amide acid unit in a polyamic acid contained in the solution in which the chemical dehydrating agent and the imidization catalyst are to be contained.

The duration of imidization is not to be unambiguously limited. It is only necessary to take a sufficient time for imidization and drying to be substantially completed. In general, in a case where a chemical curing method involving a chemical dehydrating agent is employed, the duration of imidization is appropriately set within a range from 1 to 600 seconds.

In general, an imidization method includes a chemical curing method and a thermal curing method. In the present invention, an imidization method involving a chemical dehydrating agent is defined as a chemical curing method, whereas an imidization method involving no chemical dehydrating agent is defined as a thermal curing method.

If the polyamic acid solution for forming the thermoplastic polyimide layer of the thermoplastic side B contains no imidization catalyst, there may occur a difference, between the thermoplastic side A and the thermoplastic side B, in (i) presence or absence of layer peeling or (ii) peel strength of a metal foil. Such a difference varies according to (i) respective structures of the thermoplastic polyimide layers and the non-thermoplastic polyimide layer and (ii) respective thicknesses of the thermoplastic polyimide layers.

In a case where the structure of the thermoplastic polyimide is different from that of the non-thermoplastic polyimide (for example, less than 60% of the total number of moles of an acid dianhydride monomer and a diamine monomer which constitute a polyamic acid that forms the thermoplastic polyimide is of monomers identical to an acid dianhydride monomer and a diamine monomer which constitute a polyamic acid that forms the non-thermoplastic polyimide), a gel film of the thermoplastic polyimide is easily peeled off from a gel film of the non-thermoplastic polyimide. Thus, when a three-layer gel film is peeled off from the support, a gel film (thermoplastic side B) of the thermoplastic polyimide may remain partially adhered to the support. This leaves a peeling trace on the thermoplastic side B. As a result, when the resulting film has been processed into a flexible metal-clad laminate, there may be (i) an appearance defect on the thermoplastic side B or (ii) a variation in peel strength with respect to a copper foil. This is presumably because the polyamic acid in the non-thermoplastic polyimide layer is higher in rate of imidization than the polyamic acid in the thermoplastic polyimide layers. However, in the case where the polyamic acid solution for the thermoplastic side B contains an imidization catalyst, the rate of imidization of the polyamic acid in the thermoplastic polyimide is closer to the rate of imidization of the polyamic acid in the non-thermoplastic polyimide. Thus, cases where a gel film of the thermoplastic polyimide remains adhered to the support are reduced. As a result, it is possible to reduce a property difference between the thermoplastic side A and the thermoplastic side B.

In a case where the structure of the thermoplastic polyimide is similar to that of the non-thermoplastic polyimide (for example, 60% or more of the total number of moles of an acid dianhydride monomer and a diamine monomer which constitute a polyamic acid that forms the thermoplastic polyimide is of monomers identical to an acid dianhydride monomer and a diamine monomer which constitute a polyamic acid that forms the non-thermoplastic polyimide), there is only a small difference, due to the structural similarity, between (i) the rate of imidization of the polyamic acid in the non-thermoplastic polyimide and (ii) the rate of imidization of the polyamic acid in the thermoplastic polyimide, and cases where the three-layer gel film of the thermoplastic polyimide remains adhered to the support are originally reduced.

However, in a case where the thermoplastic polyimide layer of the thermoplastic side A of the three-layer polyimide film and the thermoplastic polyimide layer of the thermoplastic side B of the three-layer polyimide film each have a thickness of 2.5 µm or more, there would be a difference in peel strength of a metal foil between the thermoplastic side A and the thermoplastic side B. This is presumably due to influence of (i) the fact that there occurs a difference between the rate of imidization reaction of the polyamic acid on the thermoplastic side A and the rate of imidization reaction of the polyamic acid on the thermoplastic side B and (ii) the fact that such a thermoplastic polyimide becomes similar in property to the non-thermoplastic polyimide. This is presumably because, as described above, the chemical dehydrating agent and imidization catalyst contained in the polyamic acid solution for forming the non-thermoplastic polyimide layer tend more to exude from the thermoplastic side A, and are less likely to exude from the thermoplastic side B. With the arrangement in which the polyamic acid solution for the thermoplastic side B contains an imidization catalyst to compensate for a difference in easiness of such moving through, it is possible to reduce the property difference between the thermoplastic side A and the thermoplastic side B. On the other hand, if the polyamic acid solution for the thermoplastic side A contains an imidization catalyst, the imidization catalyst in the polyamic acid solution for the thermoplastic side B will have a reduced effect. Thus, the polyamic acid solution for the thermoplastic side A preferably contains no imidization catalyst.

The phrase "60% or more of a total number of moles of an acid dianhydride monomer and a diamine monomer which constitute a polyamic acid that forms the thermoplastic polyimide layers is identical to an acid dianhydride monomer and a diamine monomer which constitute a polyamic acid that forms the non-thermoplastic polyimide layer" refers to the following: With reference to a total number of moles (gross number of moles) of an acid dianhydride monomer and a diamine monomer which constitute a polyamic acid that forms the thermoplastic polyimide layers, 60% or more of the total number of moles is identical to an acid dianhydride monomer and a diamine monomer which constitute a polyamic acid that forms the non-thermoplastic polyimide layer. The above value is calculated by the following formula: (number of moles of an identical type)/(gross number of moles).

In the case where 60% or more of the total number of moles of the acid dianhydride monomer(s) and the diamine monomer(s) which constitute the polyamic acid that forms the thermoplastic polyimide is identical to the acid dianhydride monomer(s) and the diamine monomer(s) which constitute the polyamic acid that forms the non-thermoplastic polyimide, the thermoplastic polyimide layer of a three-layer gel film tends less to adhere to the support. The above value is preferably (i) 70% or more, or more preferably (ii) 80% or more. The ratio has an upper limit of preferably (i) 99% or less, or more preferably (ii) 98% or less.

Tension to be applied to the polyimide layers during imidization is preferably in a range of from 1 kg/m to 15 kg/m or particularly preferably in a range of from 5 kg/m to 10 kg/m. If the tension falls short of the range, a sag or meandering in the film during conveyance may occur, which would lead to problems such as the film getting wrinkled during winding and the film being unable to be evenly wound. On the other hand, if the tension exceeds the range, the film is heated at a high temperature with a high tension applied to the film. This may deteriorate the dimensional properties of a metal-clad laminate that is fabricated using a substrate for a metal-clad laminate.

The three-layer polyimide film has a thickness of preferably not smaller than 7.5 µm and not larger than 125 µm. At least one of the thermoplastic polyimide layers on both surfaces of the non-thermoplastic polyimide layer in the three-layer polyimide film has a thickness of preferably (i) not smaller than 1.7µ and not larger than 35 µm, more preferably (ii) not smaller than 1.7 µm and not larger than 10 µm, or particularly preferably (iii) not smaller than 1.7 µm and not larger than 8 µm. If the thickness is smaller than 1.7 µm, the adhesion to a copper foil would possibly, although depending on roughness of a surface of a metal foil, be decreased. If the thickness is larger than 35 µm, a dimensional change rate observed after etching of the metal foil of the metal foil-clad laminate would possibly be more negative in value.

The description below deals with a method for producing a three-layer polyimide film by three-layer coextrusion.

The following explains a commonly used method. The solution extruded from a three-layer extrusion die is continuously extruded onto a flat and smooth support, and then at least part of the solvent in a form of three-layer thin films on the support is volatilized, whereby a three-layer gel film having a self-supporting property is obtained. The three-layer polyamic acid on the support is preferably heated at a maximum temperature of 100 to 200° C.

Furthermore, the three-layer gel film is peeled off from the support, and finally, the three-layer gel film is sufficiently treated with heat at a high temperature (250 to 600° C.) so that the solvent is substantially eliminated and the progression of imidization is completed, whereby a three-layer polyimide film is obtained. The three-layer gel film peeled off from the support is at an intermediate stage of curing from polyamic acid to polyimide and has a self-supporting property, and the content of volatile portions ranges from 5 to 200% by weight, preferably from 10 to 100% by weight, or more preferably from 30 to 80% by weight. The content of volatile portions is calculated from the following formula (I):

$$(A-B) \times 100/B \qquad \text{Formula (I)}$$

where A is a weight of the three-layer film, and B is a weight of the three-layer film after being heated at 450° C. for 20 minutes. A three-layer gel film falling within this range is suitably used. This range is preferable because it is possible to inhibit problems such as (i) breakage of the film in a process of calcination, (ii) unevenness of color tone of the film due to unevenness of drying, and (iii) variations in properties. Further, for the purpose of improving molten flowability of the thermoplastic polyimide layer, the rate of imidization may be intentionally lowered and/or the solvent may be intentionally allowed to remain.

In the present invention, the support is a support (i) onto which the three-layer liquid film extruded from the three-layer extrusion die is cast-flown, (ii) on which the three-layer liquid film is dried by heating, and (iii) which imparts a self-supporting property to the three-layer liquid film. The support can take any shape. However, in consideration of productivity of adhesive films, the support preferably takes a shape of a drum or a belt. Further, the support may be made of any material. Examples materials encompass metal, plastic, glass, ceramic, etc., preferably metal, or more preferably SUS material, which has great resistance to corrosion. Further, the support may be plated with a metal such as Cr, Ni, and Sn.

The three-layer extrusion die used may be of various structures. For example, a T die for producing films for multiple layers or the like can be used. Alternatively, it is possible to suitably use a die of any of the conventionally known structures, and especially suitably usable examples encompass a feed block T die and a multi-manifold T die.

A preferable solvent for synthesizing polyamic acid in the present invention may be any solvent that dissolves polyamic acid, but examples can encompass amide solvents, i.e., N,N-dimethylformamide, N,N-dimethylacetamide, N-methyl-2-pyrrolidone, etc. Among these, N,N-dimethylformamide and N,N-dimethylacetamide can be especially preferably used.

For polymerization of a non-thermoplastic polyamic acid in the present invention, any method for adding a monomer may be used. Representative examples of the polymerization method are as follows:

(1) A method of (i) dissolving an aromatic diamine in an organic polar solvent and (ii) causing the aromatic diamine to react with a substantially equimolar amount of an aromatic tetracarboxylic acid dianhydride for polymerization of the aromatic diamine and the aromatic tetracarboxylic acid dianhydride;

(2) A method of (i) causing an aromatic tetracarboxylic acid dianhydride and a smaller molar amount of an aromatic diamine compound to react in an organic polar solvent, thereby forming a prepolymer having acid anhydride groups at both terminals, and then (ii) using the aromatic diamine compound for polymerization of the prepolymer so that the aromatic tetracarboxylic acid dianhydride and the aromatic diamine compound are substantially equal in mole to each other overall the whole process;

(3) A method of (i) causing an aromatic tetracarboxylic acid dianhydride and an excessive molar amount of an aromatic diamine compound to react in an organic polar solvent, thereby forming a prepolymer having amino groups at both terminals, and then, (ii) after further adding the aromatic diamine compound to the resulting solution, using the aromatic tetracarboxylic acid dianhydride for polymerization of the prepolymer so that the aromatic tetracarboxylic acid dianhydride and the aromatic diamine compound are substantially equal in mole to each other overall the whole process;

(4) A method of, after dissolving and/or dispersing an aromatic tetracarboxylic acid dianhydride in an organic polar solvent, using an aromatic diamine compound for polymerization of an aromatic tetracarboxylic acid dianhydride and the aromatic diamine compound so that the aromatic tetracarboxylic acid dianhydride and the aromatic diamine compound are substantially equal in mole to each other; and (5) A method of causing a mixture of an aromatic tetracarboxylic acid dianhydride and an aromatic diamine that are substantially equal in mole to each other to react in an organic polar solvent for polymerization of the aromatic tetracarboxylic acid dianhydride and the aromatic diamine.

These methods may be used alone or can be used by being partially combined.

In particular, the polyamic acid of the non-thermoplastic polyimide layer is preferably obtained through the following steps (a) to (c):

(a) causing an aromatic acid dianhydride and an excessive molar amount of an aromatic diamine to react in an organic polar solvent, thereby forming a prepolymer having amino groups at both terminals;

(b) then further adding the aromatic diamine to the resulting solution; and (c) further adding the aromatic acid dianhydride for polymerization of the prepolymer so that the aromatic acid dianhydride and the aromatic diamine are substantially equal in mole to each other overall the whole process, thereby obtaining a polyamic acid solution.

The prepolymer obtained during the step (a) is, among the above methods, preferably a thermoplastic block component. The description below deals with a method for determining whether a prepolymer is a thermoplastic block component or not.

(Method for Determining Thermoplastic Block Component)

This method adjusts respective amounts of the acid dianhydride and the diamine used for prepolymer production to equimolar amounts. (In a case where a plurality of types of acid dianhydrides were used, a ratio thereof was fixed. In a case where a plurality of types of diamines were used, a ratio thereof was fixed as well.) The method next (i) cast-flows the resulting polyamic acid solution onto an aluminum foil with use of a Comma coater, (ii) heats the cast-flown solution at 130° C. for 100 seconds, (iii) peels off a gel film having a self-supporting property from the aluminum foil, and (iv) fixes the gel film into a metal frame. The method then heat-treated the gel film at 300° C. for 20 seconds and then at 450° C. for 1 minute. During this operation, the method determined in a case where the film was softened or melted to have a deformed appearance that the acid dianhydride and the diamine contained a thermoplastic block component.

An acid dianhydride and a diamine which may each be a thermoplastic block component are not particularly limited. However, as the acid dianhydride, it is preferable to use (i) 3,3',4,4'-biphenyltetracarboxylic acid dianhydride or 3,3',4,4'-benzophenonetetracarboxylic acid dianhydride as an essential component, or more preferable to use (ii) 3,3',4,4'-benzophenonetetracarboxylic acid dianhydride as an essential component in terms of balance between viscoelasticity and heat resistance. As the diamine, it is preferable to use 2,2-bis[4-(4-aminophenoxy)phenyl]propane as an essential component.

A method for producing a thermoplastic polyamic acid for a thermoplastic polyimide preferably includes the step (a) of causing (i) an acid dianhydride or a diamine and (ii) an excessive amount of a diamine or an acid dianhydride to react in an organic polar solvent, thereby forming a prepolymer having amino groups or acid anhydrides at both terminals, and the step (b) of then adding the acid dianhydride or the diamine for polymerization of the prepolymer so that the ratio between the acid dianhydride and the diamine overall the whole process is a predefined ratio. In the step (b), examples of the method for adding the acid dianhydride or the diamine encompass a method of inputting a powder, a method of inputting an acid solution obtained by dissolving an acid dianhydride in advance in an organic polar solvent, etc. For the reaction to proceed uniformly, the method of inputting an acid solution is preferable.

The solid-content concentrations of the non-thermoplastic polyamic acid and the thermoplastic polyamic acid during polymerization preferably range from 10 to 30% by weight. The solid-content concentration can be determined according to the rate of polymerization and the viscosity of the polymerization solution. The viscosity of the polymerization solution can be set in accordance with (i) a case of coating of a support film with a polyamic acid solution of the thermoplastic polyimide or (ii) a case of coextrusion with the non-thermoplastic polyimide. However, in the case of coating, the viscosity of the polymerization solution is preferably equal to or less than 100 poise, for example, at a solid-content concentration of 14% by weight. Further, in the case of coextrusion, the viscosity of the polymerization solution preferably ranges from 100 poise to 1200 poise, for example, at a solid-content concentration of 14% by weight. For the resulting three-layer polyimide film to have a uniform thickness, the viscosity of the polymerization solution more preferably ranges from 150 poise to 800 poise, for example, at a solid-content concentration of 14% by weight. The aromatic acid dianhydride and the aromatic diamine can be used in a different order in consideration of the properties and productivity of the three-layer polyimide film.

Further, for the purpose of improving the properties of the film, such as slidability, thermal conductivity, electric conductivity, and corona resistance, it is possible to add a filler to the non-thermoplastic polyamic acid and the thermoplastic polyamic acid. Preferable examples of the filler encompass, but are not particularly limited to, silica, titanium oxide, alumina, silicon nitride, boron nitride, calcium hydrogen phosphate, calcium phosphate, mica, etc.

In a case where the filler is added to improve the slidability of the film, a particle diameter of the filler ranges (i) from 0.1 to 10 μm, or preferably (ii) from 0.1 to 5 μm. If the particle diameter falls short of this range, an effect of improving slidability is hardly seen. If the particle diameter exceeds this range, it tends to become difficult to create a fine wiring pattern. Furthermore, in the case of adding the filler, the dispersion state of the filler is also important. The filler should not form, per square meter, (i) more than fifty aggregates having an average diameter of 20 μm or lager, or preferably (ii) more than forty aggregates having an average diameter of 20 μm or lager. If the number of filler aggregates having an average diameter of 20 μm or lager exceeds this range, the filler aggregates may lead to cissing of an adhesive during adhesive coating, or may produce a reduction in joining area when a high-definition wiring pattern is created, thus tending to degrade the insulation reliability of a flexible printed board per se.

The filler may be added, for example, by any method such as the following methods:

(1) A method of adding the filler to a polymerization solution before or during polymerization;

(2) A method of kneading the filler by using a three-piece roller or the like after completion of polymerization;

(3) A method of preparing a dispersion liquid containing the filler and mixing the dispersion liquid into a polyamic acid organic solvent solution; and (4) A method of dispersing the filler by a bead mill or the like.

Among others, the method of mixing a dispersion liquid containing the filler into a polyamic acid solution or, in particular, a method of mixing a dispersion liquid containing the filler into a polyamic acid solution immediately before film formation is preferable because the method best prevents the filler from contaminating a production line.

In preparing a dispersion liquid containing the filler, such a dispersion liquid is preferably the same solvent as the solvent for polymerization of the polyamic acid. Further, for satisfactory dispersion of the filler and a stable dispersion state, it is possible to use a dispersing agent, a thickening agent, or the like within such a range as not to affect the film properties.

Polyimide is obtained by a dehydration reaction from a precursor to polyimide, i.e., polyamic acid. There are two most widely known methods for dehydration reaction: (i) a heat curing method for dehydration reaction solely by heat and (ii) a chemical curing method for dehydration reaction with use of a dehydrating agent. The chemical curing method is more preferably employed because it is superior in productivity. In the thermal curing method and the chemical curing method, the use of an imidization catalyst is preferable, in view of accelerating progress of an imidization reaction.

The chemical dehydrating agent here is a dehydrating and ring-closing agent for polyamic acid, and can be preferably composed mainly of an aliphatic acid anhydride, an aromatic acid anhydride, N,N'-dialkylcarbodiimide, a lower aliphatic alkyl halide, a halogenated lower aliphatic alkyl acid anhydride, dihalide arylsulfonate, thionyl halide, or a mixture of two or more of them. Among them, an aliphatic acid anhydride and an aromatic acid anhydride exhibit satisfactory action. Further, the imidization catalyst is a component having an effect of facilitating the dehydrating and ring-closing action of the curing agent for polyamic acid, and usable examples of the imidization catalyst include aliphatic tertiary amines, aromatic tertiary amines, and heterocyclic tertiary amines. Among them, a nitrogen-containing heterocyclic compound such as imidazole, benzimidazole, isoquinoline, quinoline, or β-picoline is preferable. Furthermore, introduction of an organic polar solvent into a solution including the dehydrating agent and the imidization catalyst can be selected as needed.

Examples of a method for producing a three-layer polyimide film encompass a method of (i) applying a thermoplastic polyamic acid solution to a non-thermoplastic polyimide film produced in advance, (ii) drying the applied solution, and then (iii) heating the dried product at a high temperature of 200° C. or higher to produce a three-layer polyimide film. This method, however, involves a large number of steps. It is therefore preferable in terms of productivity to produce a three-layer polyimide film by three-layer coextrusion.

A method for producing a flexible metal-clad laminate according to the present invention is described below, but is not to be limited to this.

It is preferable that the method for producing a flexible metal-clad laminate according to the present invention include the step of bonding a metal foil (for example, copper foil) to the three-layer polyimide film. As a copper foil to be used in the flexible metal-clad laminate, a copper foil having a thickness of 1 to 25 μm can be used, and a rolled copper foil or an electrolytic copper foil may be used.

A usable example of a method for bonding a metal foil to the three-layer polyimide film is continuous processing by (i) a heat roller laminating apparatus having one or more pairs of metal rollers or by (ii) a double belt press (DBP). Among them, the heat roller laminating apparatus having one or more pairs of metal rollers is preferably used because the apparatus is simple in configuration and advantageous in term of maintenance cost.

The term "heat roller laminating apparatus having one or more pairs of metal rollers" needs only mean an apparatus having metal rollers for heating and pressing a material, and a specific configuration of the apparatus is not to be particularly limited.

It should be noted that the step of bonding a metal foil to the three-layer polyimide film by heat laminating is hereinafter referred to as "heat laminating step".

A specific configuration of means for executing the heat laminating step (such means being hereinafter referred to sometimes as "heat laminating means") is not to be particularly limited. However, in order for the resulting laminate to have a satisfactory appearance, it is preferable that a protection material be placed between the pressurized surface and the metal foil.

Examples of the protection material encompass materials that can withstand the heating temperature of the heat laminating step, e.g., heat-resistant plastic such as a non-thermoplastic polyimide film and metal foil such as copper foil, aluminum foil, and SUS foil. Among them, a non-thermoplastic polyimide film or a film made of a thermoplastic polyimide whose glass transition temperature (Tg) is 50° C. or more higher than the laminating temperature is preferable because of its excellent balance between heat resistance, reusability, etc. In the case of use of a thermoplastic polyimide, selection of a thermoplastic polyimide that satisfies the above condition makes it possible to prevent the thermoplastic polyimide from adhering to the rollers.

Further, when the protection material is thin, the protection material does not sufficiently fulfill its role as buffering and protection during lamination. Therefore, it is preferable that the non-thermoplastic polyimide film have a thickness of 75 μm or greater.

Further, the protection material does not need to be a single layer, but may have a multilayer structure (for example, a three-layer structure) having two or more layers with different properties.

Further, in a case where the laminating temperature is a high temperature, direct use of the protection material for lamination may lead to a rapid thermal expansion that undermines the appearance and dimensional stability of the resulting flexible metal-clad laminate. Therefore, the protection material is preferably subjected to preheating before lamination. In such a case of lamination after preheating of the protection material, the influence on the appearance and dimensional properties of the flexible metal-clad laminate is curbed since the protection material has finished thermally expanding.

An example of preheating means is a method of bringing the protection material into contact with a heating roller, for example, by holding the protection material on the heating roller. The duration of contact is preferably (i) 1 second or longer, or more preferably (ii) 3 seconds or longer. If the duration of contact is shorter than that, the lamination is carried out before the protection material finishes thermally expanding. This causes a rapid thermal expansion in the protection material during lamination, thus deteriorating the appearance and dimensional properties of the resulting flexible metal-clad laminate. The distance for which the protection material is held on the heating roller is not particularly limited, but may be adjusted as needed on the basis of the diameter of the heating roller and the duration of contact.

A method by which the materials to be laminated are heated in the heat laminating means is not to be particularly limited, and it is possible to use heating means employing a conventionally publicly known method that allows for heating at a predetermined temperature, such as a heat circulation method, a hot-air heating method, or an induction heating method. Similarly, a method by which the materials to be laminated are pressurized in the heat laminating means is also not to be particularly limited, and it is possible to use pressurizing means employing a conventionally publicly known method that allows for application of a predetermined pressure, such as a hydraulic method, an air pressure method, or an inter-gap pressure method.

The heating temperature during the heat laminating step, i.e., the laminating temperature is preferably (i) a temperature equal to or higher than the glass transition temperature (Tg) of the thermoplastic polyimide of the three-layer polyimide film plus 50° C., or more preferably (ii) a temperature equal to or higher than Tg of the thermoplastic polyimide of the three-layer polyimide film plus 100° C. At a temperature equal to or higher than Tg+50° C., the three-layer polyimide film and the metal foil can be satisfactorily laminated by the heat. Alternatively, at a temperature equal to or higher than Tg+100° C., the productivity of laminates by thermal lamination can be improved by raising the rate of lamination.

In particular, since the polyimide film used as a core of the three-layer polyimide film of the present invention is designed so that thermal stress relaxation is effective in laminating, a flexible metal-clad laminate having great dimensional stability is obtained with high productivity.

The duration of contact of the flexible metal-clad laminate with the heating roller is preferably (i) 0.1 second or longer, more preferably (ii) 0.2 second or longer, or especially preferably (iii) 0.5 second or longer. If the duration of contact falls short of the range, a sufficient relaxation effect may not be brought about. A preferable upper limit to the duration of contact is 5 second or shorter. Contact longer than 5 seconds is not preferable, because it (i) does not bring about a greater relaxation effect, (ii) leads to a decrease in rate of lamination, and (iii) places restrictions on the layout of the line.

Further, even when slowly cooled in contact with the heating roller after lamination, the flexible metal-clad laminate still has a great difference in temperature from room temperature, and in some case, the residual strain may not have been completely relieved. For this reason, it is preferable that the flexible metal-clad laminate after slow cooling in contact with the heating roller be subjected to a postheat step with the protection material placed thereon. It is preferable that tension during the postheat step range from 1 to 10 N/cm. Further, it is preferable that an ambient temperature during postheating range from (Laminating temperature−200° C.) to (Laminating temperature+100° C.).

The term "ambient temperature" here means a temperature of an external surface of the protection material in close contact with both surfaces of the flexible metal-clad laminate. Although an actual temperature of the flexible metal-clad laminate varies somewhat depending on a thickness of the protection material, setting the temperature of the surface of the protection material within the range makes it possible to bring about the effects of postheating. Measurement of the temperature of the external surface of the protection material can be performed by using a thermocouple, a thermometer, or the like.

The rate of lamination in the heat laminating step is preferably (i) 0.5 m/min or higher, or more preferably (ii) 1.0 m/min or higher. At a rate of lamination of 0.5 m/min or higher, sufficient thermal lamination becomes possible. Furthermore, at a rate of lamination of 1.0 m/min or higher, a further improvement in productivity can be brought about.

As for a pressure during the heat laminating step, i.e., a laminating pressure, there is such an advantage that the higher the laminating pressure is, the lower the laminating temperature and the higher the rate of lamination can be made. However, in general, an excessively high laminating pressure tends to aggravate a change in dimension of the resulting laminate. On the other hand, an excessively low laminating pressure leads to a decrease in adhesive strength of the metal foil of the resulting laminate. For this reason, it is preferable that the laminating pressure fall within the range of (i) 49 to 490 N/cm (5 to 50 kgf/cm), or more preferably (ii) 98 to 294 N/cm (10 to 30 kgf/cm). Within this range, the three conditions, namely the laminating temperature, the rate of lamination, and the laminating pressure, can be satisfied, so that a further improvement in productivity can be brought about.

It is preferable that a tension of an adhesive film in the laminating step fall within the range of (i) 0.01 to 4 N/cm, more preferably (ii) 0.02 to 2.5 N/cm, or especially preferably (iii) 0.05 to 1.5 N/cm. If the tension falls short of this range, a sag or meandering in the laminate during conveyance makes it impossible for the laminate to be evenly fed to the heating roller, thus making it difficult to obtain a flexible metal-clad laminate having a satisfactory appearance. On the other hand, if the tension exceeds the range, the tension exerts such a strong influence that cannot be alleviated by controlling Tg and the modulus of storage elasticity of the adhesive layer, thus bringing about deterioration in dimensional stability.

A flexible metal-clad laminate according to the present invention is preferably obtained by using a heat laminating apparatus that continuously carries out heating pressure bonding of the materials to be laminated. Furthermore, in such a heat laminating apparatus, (i) material-to-be-laminated unreeling means for unreeling the materials to be laminated may be provided in the upstream of the heat laminating means, and (ii) material-to-be-laminated winding means for winding the materials to be laminated may be provided in the downstream of the heat laminating means. Provision of these means can bring about a further improvement in productivity of the heat laminating apparatus.

Possible examples of specific configurations of the material-to-be-laminated unreeling means and the material-to-be-laminated winding means encompass, but are not particularly limited to, a publicly known roll winding machines, etc. capable of winding the adhesive film, the metal foil, or the resulting laminate.

Furthermore, it is more preferable that (i) protection material winding means for winding the protection material and (ii) protection material unreeling means for unreeling the protection material be provided. Provision of the protection material winding means and the protection material unreeling means makes it possible to reuse the protection material in the heat laminating step by winding the protection material after use and placing it on the unreeling side again.

Further, (i) edge position detecting means and (ii) winding position correcting means may be provided so that the protection material can be wound with each edge of the protection material aligned. This makes it possible to accurately wind the protection material with each edge aligned, thus making it possible to enhance the efficiency in the reuse of the protection material. It should be noted that the protection material winding means, the protection material unreeling means, the edge position detecting means, and the winding position correcting means are not to be particularly limited to specific configurations, but can be realized by various conventionally publicly known apparatuses.

It is preferable that the peel strength of the three-layer polyimide film and the metal foil of the metal-clad laminate be 10 N/cm or greater.

The present invention can alternatively be arranged as described below.

A preferable embodiment of the present invention is such that the polyamic acid solution for forming the thermoplastic polyimide layer to be in direct contact with the support contains a/the chemical dehydrating agent and the imidization catalyst.

A preferable embodiment of the present invention is such that 60% or more of a total number of moles of an acid dianhydride monomer and a diamine monomer which constitute a polyamic acid that forms the thermoplastic polyimide layers is identical to an acid dianhydride monomer and a diamine monomer which constitute a polyamic acid that forms the non-thermoplastic polyimide layer.

A preferable embodiment of the present invention is such that the thermoplastic polyimide layers of the three-layer coextrusion polyimide film each have a thickness of not less than 2.5 µm and not greater than 10 µm.

A preferable embodiment of the present invention is such that a/the polyamic acid that forms the non-thermoplastic polyimide layer contains a thermoplastic block component in its molecule.

EXAMPLES

In the following, the present invention is specifically described by way of examples. However, the present invention is not to be limited to these examples. It should be noted that in Examples, Synthesis Examples, and Comparative Examples, a three-layer polyimide film and the peel strength of a metal foil were evaluated in the following manners.

(Method for Fabricating a Metal-Clad Laminate)

A flexible metal-clad laminate was fabricated by (i) placing 18-µm-thick rolled copper foils (BHY-22B-T; manufactured by Nippon Mining & Metals Corporation) respectively on both surfaces of a three-layer polyimide film, (ii) further placing a protective material (Apical 125NPI; manufactured by Kaneka Corporation) on both sides, and (iii) carrying out thermal lamination continuously at a laminating temperature of 380° C. under a laminating pressure of 294 N/cm (30 kgf/cm) at a rate of lamination of 1.0 m/min with use of a heat roller laminating machine.

(Metal Foil Peel Strength)

In conformity to JIS C6471 "6.5 Peel-strength", a sample was fabricated, and the load at which a 3-mm-wide portion of metal foil was peeled from the sample at a peeling angle of 90 degrees and at 200 mm/min was measured. A side on which a thermoplastic polyimide layer in direct contact with the support was present was named side B, whereas a side opposite from the above side was named side A.

(Evaluation of Soldering Heat Resistance)

Test pieces in a size of 3 cm×3 cm were cut out from the flexible metal-clad laminate, and evaluated for soldering heat resistance in a normal state and a moist state. For the normal state, a test piece was adjusted at 23° C./55% RH for 24 hours, and then allowed to float on a heated solder bath for 30 seconds. Next, a copper foil which was in contact with the solder bath was etched, and whether there was bulging was determined. A table shows temperatures of the solder bath at which temperatures no bulging was found. For the moist state, a test piece was adjusted at 85° C./85% RH for 24 hours, and then allowed to float on a heated solder bath for 30 seconds. Next, a copper foil which was in contact with the solder bath was etched, and whether there was bulging was determined. The table shows temperatures of the solder bath at which temperatures no bulging was found.

The following shows the abbreviated names of monomers that are used in the Synthesis Examples.

DMF: N,N-dimethylformamide
BAPP: 2,2-bis[4-(4-aminophenoxy)phenyl]propane
ODA: 4,4'-diaminodiphenylether
PDA: p-phenylenediamine
BPDA: 3,3',4,4'-biphenyltetracarboxylic acid dianhydride
BTDA: 3,3',4,4'-benzophenonetetracarboxylic acid dianhydride
PMDA: pyromellitic acid dianhydride The following shows Synthesis Examples of polyamic acid solutions.

Synthesis Example 1

BAPP (57.3 g: 0.140 mol) and ODA (18.6 g, 0.093 mol) were dissolved in DMF (1173.5 g) cooled to 10° C. To the resulting solution, BTDA (30.0 g: 0.093 mol) and PMDA (25.4 g: 0.116 mol) were added. The resulting mixture was evenly stirred for 30 minutes to form a prepolymer.

After PDA (25.2 g: 0.233 mol) had been dissolved in this solution, PMDA (46.9 g: 0.215 mol) was dissolved. To the resulting solution, 115.1 g of a 7.2 wt % DMF solution of PMDA (PMDA: 0.038 mol) separately prepared was carefully added. The addition was stopped when a viscosity of approximately 2500 poise was obtained. The resulting mixture was stirred for 1 hour. Thus obtained was a polyamic acid solution having a rotational viscosity of 2600 poise at 23° C.

The polyamic acid solution obtained as above was cast-flown onto an aluminum foil with use of a Comma coater, and heated at 130° C. for 100 seconds. Then, a gel film having a self-supporting property was peeled off from the aluminum foil, and fixed into a metal frame. Next, the gel film was heat-treated at 300° C. for 20 seconds and then at 450° C. for 1 minute. During this operation, there was no deformation in appearance of the film, and the film was determined as non-thermoplastic.

A polyamic acid solution synthesized from an equimolar amount of the acid dianhydrides and the diamine used to produce the prepolymer was cast-flown onto an aluminum foil with use of a Comma coater, and heated at 130° C. for 100 seconds. Then, a gel film having a self-supporting property was peeled off from the aluminum foil, and fixed into a metal frame. Next, the gel film was heat-treated at 300° C. for 20 seconds and then at 450° C. for 1 minute. During this operation, the film was melted to have a deformed appearance, and the film was thus determined as a thermoplastic block component.

Synthesis Example 2

ODA (147.0 g, 0.734 mol) was dissolved in DMF (1612.5 g) cooled to 10° C. To the resulting solution, PMDA (211.3 g: 0.969 mol) was added. The resulting mixture was evenly stirred for 30 minutes to form a prepolymer.

PDA (20.0 g: 0.185 mol) had been dissolved in this solution. After that, to the resulting solution, 119.3 g of a 5 wt % DMF solution of PDA (PDA: 0.055 mol) separately prepared was carefully added. The addition was stopped when a viscosity of approximately 2500 poise was obtained. The resulting mixture was stirred for 1 hour. Thus obtained was a polyamic acid solution having a rotational viscosity of 2700 poise at 23° C.

The polyamic acid solution obtained as above was cast-flown onto an aluminum foil with use of a Comma coater, and heated at 130° C. for 100 seconds. Then, a gel film having a self-supporting property was peeled off from the aluminum foil, and fixed into a metal frame. Next, the gel film was heat-treated at 300° C. for 20 seconds and then at 450° C. for 1 minute. During this operation, there was no deformation in appearance of the film, and the film was determined as non-thermoplastic.

A polyamic acid solution synthesized from an equimolar amount of the acid dianhydrides and the diamine used to produce the prepolymer was cast-flown onto an aluminum foil with use of a Comma coater, and heated at 130° C. for 100 seconds. Then, a gel film having a self-supporting property was peeled off from the aluminum foil, and fixed into a metal frame. Next, the gel film was heat-treated at 300° C. for 20 seconds and then at 450° C. for 1 minute. During this operation, there was no deformation in appearance of the film, and the film was thus determined as not a thermoplastic block component.

Synthesis Example 3

A polyamic acid solution having a solid-content concentration of approximately 17% by weight and a rotational viscosity of 800 poise at 23° C. was obtained by adding BPDA (85.6 g: 0.291 mol) first and then BAPP (118.6 g: 0.289 mol) to 937.6 g of N,N-dimethylformamide (DMF). Thereafter, a polyamic acid solution having a solid-content concentration of 14% by weight was obtained by adding DMF.

Synthesis Example 4

BAPP (118.6 g: 0.289 mol) was dissolved in 843.4 g of N,N-dimethylformamide (DMF). BPDA (12.7 g: 0.043 mol) was put into the resulting solution, and the resulting mixture was heated to 50° C. and then cooled to 10° C. PMDA (48.6 g: 0.223 mol) was added to the resulting mixture, whereby a prepolymer was obtained.

To the resulting solution, 65.4 g of a 7 wt % DMF solution of PMDA (PMDA: 0.021 mol) separately prepared was carefully added. Thus obtained was a polyamic acid solution having a solid-content concentration of approximately 17% by weight and a rotational viscosity of 800 poise at 23° C. Thereafter, a polyamic acid solution having a solid-content concentration of 14% by weight was obtained by adding DMF.

Example 1

By using a multi-manifold-type three-layer coextrusion three-layer extrusion die having a lip width of 200 mm, a three-layer structure composed of the polyamic acid solution of Synthesis Example 3, the polyamic acid solution of Synthesis Example 1, and the polyamic acid solution of Synthesis Example 3 stacked in this order was extruded and cast-flown onto an aluminum foil. Next, after the resulting three-layer film was heated at 150° C. for 100 seconds, a gel film having a self-supporting property was removed, fixed into a metal frame, and dried and imidized at 250° C. for 40 seconds, 300° C. for 60 seconds, 350° C. for 60 seconds, and 370° C. for 30 seconds. Thus obtained was a three-layer polyimide film whose thermoplastic polyimide layer, non-thermoplastic polyimide layer, and thermoplastic polyimide layer have thicknesses of 2.7 µm, 12.6 µm, and 2.7 µm, respectively.

During the above operation, 80 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 1 was inputted to the three-layer extrusion die, added to 100 g of the polyamic acid solution and mixed therewith with use of a mixer.

Further, 20 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 3 was inputted to the three-layer extrusion die, added to 100 g of only the polyamic acid solution of a surface (side B) in direct contact with the support, and mixed therewith with use of a mixer.

No chemical dehydrating agent or imidization catalyst was added to a polyamic acid solution of a surface (side A) in no contact with the support.

After the fabrication of a metal-clad laminate with use of the three-layer polyimide film, the metal foil peel-strength and the soldering heat resistance were measured. The results are tabulated in Tables 1 to 3.

Comparative Example 1

Comparative Example 1 was carried out in the same manner as Example 1 except that no chemical dehydrating agent or imidization catalyst was added to the polyamic acid solution of Synthesis Example 3 (that is, the polyamic acid solution of the surface [side B] in direct contact with the support). There was a trace of partial removal in a thermoplastic polyimide layer of the side B. After the fabrication of a metal-clad laminate with use of the three-layer polyimide film, the metal foil peel-strength and the soldering heat resistance were measured. The results are tabulated in Tables 1 to 3.

Example 2

By using a multi-manifold-type three-layer coextrusion three-layer extrusion die having a lip width of 200 mm, a three-layer structure composed of the polyamic acid solution of Synthesis Example 4, the polyamic acid solution of Synthesis Example 1, and the polyamic acid solution of Synthesis Example 4 stacked in this order was extruded and cast-flown onto an aluminum foil. Next, after the resulting three-layer film was heated at 150° C. for 100 seconds, a gel film having a self-supporting property was removed, fixed into a metal frame, and dried and imidized at 250° C. for 40 seconds, 300° C. for 60 seconds, 350° C. for 60 seconds, and 370° C. for 30 seconds. Thus obtained was a three-layer polyimide film whose thermoplastic polyimide layer, non-thermoplastic polyimide layer, and thermoplastic polyimide layer have thicknesses of 2.7 μm, 12.6 μm, and 2.7 μm, respectively.

During the above operation, 80 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 1 was inputted to the three-layer extrusion die, added to 100 g of the polyamic acid solution and mixed therewith with use of a mixer.

Further, 20 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 4 was inputted to the three-layer extrusion die, added to 100 g of only the polyamic acid solution of the side B, and mixed therewith with use of a mixer.

After the fabrication of a metal-clad laminate with use of the three-layer polyimide film, the metal foil peel-strength and the soldering heat resistance were measured. The results are tabulated in Tables 1 to 3.

Comparative Example 2

Comparative Example 2 was carried out in the same manner as Example 2 except that no chemical dehydrating agent or imidization catalyst was added to the polyamic acid solution of Synthesis Example 4 (that is, the polyamic acid solution of the surface [side B] in direct contact with the support). After the fabrication of a metal-clad laminate with use of the three-layer polyimide film, the metal foil peel-strength and the soldering heat resistance were measured. The results are tabulated in Tables 1 to 3. There was no trace of removal in a thermoplastic polyimide layer of the side B, but there was a difference in peel strength of a metal foil between the side A and the side B.

Example 3

Example 3 was carried out in the same manner as Example 2 except that an obtained three-layer polyimide film had thicknesses of 4.2 μm/16.6 μm/4.2 μm for thermoplastic polyimide layer/non-thermoplastic polyimide layer/thermoplastic polyimide layer. After the fabrication of a metal-clad laminate with use of the three-layer polyimide film, the metal foil peel-strength and the soldering heat resistance were measured. The results are tabulated in Tables 1 to 3.

Comparative Example 3

Comparative Example 3 was carried out in the same manner as Example 3 except that no chemical dehydrating agent or imidization catalyst was added to the polyamic acid solution of Synthesis Example 4 (that is, the polyamic acid solution of the surface [side B] in direct contact with the support). After the fabrication of a metal-clad laminate with use of the three-layer polyimide film, the metal foil peel-strength and the soldering heat resistance were measured. The results are tabulated in Tables 1 to 3. There was no trace of removal in a thermoplastic polyimide layer of the side B, but there was a difference in peel strength of a metal foil between the side A and the side B.

Comparative Example 4

Comparative Example 4 was carried out in the same manner as Example 3 except that the polyamic acid solution of Synthesis Example 1 was replaced by the polyamic acid solution of Synthesis Example 2 and that 80 g of a curing agent (a chemical dehydrating agent and an imidization catalyst) including acetic anhydride/isoquinoline/DMF (with a weight ratio of 33.0 g/8.3 g/58.6 g) was added to 100 g of the polyamic acid solution. After the fabrication of a metal-clad laminate with use of the three-layer polyimide film, the metal foil peel-strength and the soldering heat resistance were measured. The results are tabulated in Tables 1 to 3. While there was (i) no trace of removal in a thermoplastic polyimide layer of the side B in direct contact with the support and (ii) no difference in peel strength of a metal foil between the side A and the side B, the peel strength was lower.

Comparative Example 5

By using a multi-manifold-type three-layer coextrusion three-layer extrusion die having a lip width of 200 mm, a three-layer structure composed of the polyamic acid solution of Synthesis Example 4, the polyamic acid solution of Synthesis Example 1, and the polyamic acid solution of Synthesis Example 4 stacked in this order was extruded and cast-flown onto an aluminum foil. Next, after the resulting three-layer film was heated at 150° C. for 100 seconds, a gel film having a self-supporting property was removed, fixed into a metal frame, and dried and imidized at 250° C. for 40 seconds, 300° C. for 60 seconds, 350° C. for 60 seconds, and 370° C. for 30 seconds. Thus obtained was a three-layer polyimide film whose thermoplastic polyimide layer, non-thermoplastic polyimide layer, and thermoplastic polyimide layer have thicknesses of 4.2 μm, 16.6 μm, and 4.2 μm, respectively.

During the above operation, 80 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 1 was inputted to the three-layer extrusion die, added to 100 g of the polyamic acid solution and mixed therewith with use of a mixer.

Further, 20 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 4 was inputted to the three-layer extrusion die, added to 100 g of only the polyamic acid solution of the side A, and mixed therewith with use of a mixer, while no chemical dehydrating agent or imidization catalyst was added to the polyamic acid solution of the side B in direct contact with the support.

After the fabrication of a metal-clad laminate with use of the three-layer polyimide film, the metal foil peel-strength and the soldering heat resistance were measured. The results are tabulated in Tables 1 to 3. There was no trace of removal in a thermoplastic polyimide layer of the side B in direct contact with the support, but there was a difference in peel strength of a metal foil between the side A and the side B.

Comparative Example 6

By using a multi-manifold-type three-layer coextrusion three-layer extrusion die having a lip width of 200 mm, a three-layer structure composed of the polyamic acid solution of Synthesis Example 4, the polyamic acid solution of Synthesis Example 1, and the polyamic acid solution of Synthesis Example 4 stacked in this order was extruded and cast-flown onto an aluminum foil. Next, after the resulting three-layer film was heated at 150° C. for 100 seconds, a gel film having a self-supporting property was removed, fixed into a metal frame, and dried and imidized at 250° C. for 40 seconds, 300° C. for 60 seconds, 350° C. for 60 seconds, and 370° C. for 30 seconds. Thus obtained was a three-layer polyimide film whose thermoplastic polyimide layer, non-thermoplastic polyimide layer, and thermoplastic polyimide layer have thicknesses of 4.2 μm, 16.6 μm, and 4.2 μm, respectively.

During the above operation, 80 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 1 was inputted to the three-layer extrusion die, added to 100 g of the polyamic acid solution and mixed therewith with use of a mixer.

Further, 20 g of a curing agent (a chemical dehydrating agent and an imidization catalyst) including acetic anhydride/isoquinoline/DMF (with a weight ratio of 33.0 g/8.3 g/58.6 g) was, immediately before the polyamic acid solution obtained in Synthesis Example 4 was inputted to the three-layer extrusion die, added to 100 g of each of the respective polyamic acid solutions of the sides A and B, and mixed therewith with use of a mixer.

After the fabrication of a metal-clad laminate with use of the three-layer polyimide film, the metal foil peel-strength and the soldering heat resistance were measured. The results are tabulated in Tables 1 to 3. There was no trace of removal in a thermoplastic polyimide layer of the side B in direct contact with the support, but there was a difference in peel strength of a metal foil between the side A and the side B.

Example 4

Example 4 was carried out in the same manner as Example 1 except that 14 g of a curing agent (only an imidization catalyst) including isoquinoline/DMF (with a weight ratio of 8.3 g/58.6 g) was, immediately before the polyamic acid solution of Synthesis Example 3 was inputted to the three-layer extrusion die, added to 100 g of the polyamic acid solution (that is, the polyamic acid solution of the surface [side B] in direct contact with the support), and mixed therewith with use of a mixer. After the fabrication of a metal-clad laminate with use of the three-layer polyimide film, the metal foil peel-strength and the soldering heat resistance were measured. The results are tabulated in Tables 1 to 3.

Example 5

Example 5 was carried out in the same manner as Example 3 except that 14 g of a curing agent (only an imidization catalyst) including isoquinoline/DMF (with a weight ratio of 8.3 g/58.6 g) was, immediately before the polyamic acid solution of Synthesis Example 4 was inputted to the three-layer extrusion die, added to 100 g of the polyamic acid solution (that is, the polyamic acid solution of the surface [side B] in direct contact with the support), and mixed therewith with use of a mixer. After the fabrication of a metal-clad laminate with use of the three-layer polyimide film, the metal foil peel-strength and the soldering heat resistance were measured. The results are tabulated in Tables 1 to 3.

TABLE 1

| | | Example 1 | Comparative Example 1 | Example 2 | Comparative Example 2 | Example 3 |
|---|---|---|---|---|---|---|
| Non-thermoplastic polyimide layer | | Synthesis Example 1 | Synthesis Example 1 | Synthesis Example 1 | Synthesis Example 1 | Synthesis Example 1 |
| Thermoplastic polyimide layer | | Synthesis Example 3 | Synthesis Example 3 | Synthesis Example 4 | Synthesis Example 4 | Synthesis Example 4 |
| Presence or absence of | Side A/ side B | Absent/present | Absent/absent | Absent/present | Absent/absent | Absent/present |

TABLE 1-continued

|  |  | Example 1 | Comparative Example 1 | Example 2 | Comparative Example 2 | Example 3 |
|---|---|---|---|---|---|---|
| imidization catalyst in thermoplastic side A/ side B |  |  |  |  |  |  |
| Metal foil peel strength (N/cm) | Side A/ side B | 15/15 | 15/15 | 15/15 | 13/17 | 14/14 |
| Side B removal |  | No | Yes | No | No | No |
| Soldering heat resistance (° C.) | Normal state | 300 | 300 | 350 | 350 | 350 |
|  | Moist state | 250 | 250 | 300 | 300 | 300 |
| Thickness arrangement (μm) | Thermoplastic polyimide layer (side A) | 2.7 | 2.7 | 2.7 | 2.7 | 4.2 |
|  | Non-thermoplastic polyimide layer | 12.6 | 12.6 | 12.6 | 12.6 | 16.6 |
|  | Thermoplastic polyimide layer (side B) | 2.7 | 2.7 | 2.7 | 2.7 | 4.2 |
| Proportion (%) in thermoplastic polyimide of acid dianhydride and diamine used in non-thermoplastic polyimide |  | 50 | 50 | 93 | 93 | 93 |

TABLE 2

|  |  | Comparative Example 3 | Comparative Example 4 | Comparative Example 5 | Comparative Example 6 |
|---|---|---|---|---|---|
| Non-thermoplastic polyimide layer |  | Synthesis Example 1 | Synthesis Example 2 | Synthesis Example 1 | Synthesis Example 1 |
| Thermoplastic polyimide layer |  | Synthesis Example 4 | Synthesis Example 4 | Synthesis Example 4 | Synthesis Example 4 |
| Presence or absence of imidization catalyst in thermoplastic side A/side B | Side A/side B | Absent/absent | Absent/present | Present/absent | Present/present |
| Metal foil peel strength (N/cm) | Side A/side B | 10/18 | 8/8 | 9/18 | 10/18 |
| Side B removal |  | No | No | No | No |
| Soldering heat resistance (° C.) | Normal state | 350 | 350 | 350 | 350 |
|  | Moist state | 300 | 300 | 300 | 300 |
| Thickness arrangement (μm) | Thermoplastic polyimide layer (side A) | 4.2 | 4.2 | 4.2 | 4.2 |
|  | Non-thermoplastic polyimide layer | 16.6 | 16.6 | 16.6 | 16.6 |
|  | Thermoplastic polyimide layer (side B) | 4.2 | 4.2 | 4.2 | 4.2 |
| Proportion (%) in thermoplastic polyimide of acid dianhydride and diamine used in non-thermoplastic polyimide |  | 93 | 39 | 93 | 93 |

TABLE 3

|  |  | Example 4 | Example 5 |
|---|---|---|---|
| Non-thermoplastic polyimide layer |  | Synthesis Example 1 | Synthesis Example 1 |
| Thermoplastic polyimide layer |  | Synthesis Example 3 | Synthesis Example 4 |
| Presence or absence of imidization catalyst in | Side A/side B | Absent/present | Absent/present |

TABLE 3-continued

|  |  | Example 4 | Example 5 |
|---|---|---|---|
| thermoplastic side A/side B |  |  |  |
| Metal foil peel strength (N/cm) | Side A/side B | 15/15 | 14/14 |
| Side B removal |  | No | No |
| Soldering heat resistance (° C.) | Normal state | 300 | 350 |
|  | Moist state | 250 | 300 |
| Thickness arrangement (μm) | Thermoplastic polyimide layer (side A) | 2.7 | 4.2 |
|  | Non-thermoplastic polyimide layer | 12.6 | 16.6 |
|  | Thermoplastic polyimide layer (side B) | 2.7 | 4.2 |
| Proportion (%) in thermoplastic polyimide of acid dianhydride and diamine used in non-thermoplastic polyimide |  | 50 | 93 |

INDUSTRIAL APPLICABILITY

The present invention is applicable to, for example, production of a flexible printed circuit board.

The invention claimed is:

1. A method for producing a three-layer coextrusion polyimide film by cast-flowing polyamic acid solutions onto a support by three-layer coextrusion, the three-layer coextrusion polyimide film including, in lamination, a non-thermoplastic polyimide layer and thermoplastic polyimide layers provided on respective surfaces of the non-thermoplastic polyimide layer, wherein:
among the polyamic acid solutions, a polyamic acid solution A for forming a thermoplastic polyimide layer to be in no direct contact with the support does not contain a chemical dehydrating agent or an imidization catalyst,
a polyamic acid solution B for forming a thermoplastic polyimide layer to be in direct contact with the support contains an/the imidization catalyst, and
a polyamic acid solution for forming the non-thermoplastic polyimide layer contains a/the chemical dehydrating agent and an/the imidization catalyst;
wherein the formula of the polyamic acid solution A and the formula of the polyamic acid solution B prior to addition of a/the imidization catalyst is the same;
and wherein the difference in properties of the thermoplastic polyimide layer to be in no direct contact with the support and the properties of the thermoplastic polyimide layer to be in direct contact with the support are reduced as compared to a like construction where thermoplastic polyimide layers are prepared from polyamic acid solutions having the same amount of chemical dehydrating agent and imidization catalyst.

2. The method according to claim 1,
wherein:
the polyamic acid solution for forming the thermoplastic polyimide layer to be in direct contact with the support contains a/the chemical dehydrating agent and the imidization catalyst.

3. The method according to claim 1,
wherein:
60% or more of a total number of moles of an acid dianhydride monomer and a diamine monomer which constitute a polyamic acid that forms the thermoplastic polyimide layers are identical to an acid dianhydride monomer and a diamine monomer which constitute a polyamic acid that forms the non-thermoplastic polyimide layer.

4. The method according to claim 1,
wherein:
the thermoplastic polyimide layers of the three-layer coextrusion polyimide film each have a thickness of not less than 2.5 μm and not greater than 10 μm.

5. The method according to claim 1,
wherein:
a/the polyamic acid that forms the non-thermoplastic polyimide layer contains a thermoplastic block component in its molecule.

6. A method for producing a three-layer coextrusion polyimide film by cast-flowing polyamic acid solutions onto a support by three-layer coextrusion, the three-layer coextrusion polyimide film including, in lamination, a non-thermoplastic polyimide layer and thermoplastic polyimide layers provided on respective surfaces of the non-thermoplastic polyimide layer, wherein:
among the polyamic acid solutions, a polyamic acid solution A for forming a thermoplastic polyimide layer to be in no direct contact with the support does not contain a chemical dehydrating agent or an imidization catalyst,
a polyamic acid solution B for forming a thermoplastic polyimide layer to be in direct contact with the support contains an/the imidization catalyst, and
a polyamic acid solution for forming the non-thermoplastic polyimide layer contains a/the chemical dehydrating agent and an/the imidization catalyst;
and wherein the formula of the polyamic acid solution A and the formula of the polyamic acid solution B prior to addition of a/the imidization catalyst is the same, wherein there is no measurable difference in peel strength from a metal foil between the thermoplastic polyimide layer to be in no direct contact with the support and the thermoplastic polyimide layer to be in direct contact with the support, and there is no trace of removal of the thermoplastic polyimide layer to be in direct contact with the support upon removal from the support.

7. The method according to claim 6,
wherein:
the polyamic acid solution for forming the thermoplastic polyimide layer to be in direct contact with the support contains a/the chemical dehydrating agent and the imidization catalyst.

8. The method according to claim 6,
wherein:
60% or more of a total number of moles of an acid dianhydride monomer and a diamine monomer which constitute a polyamic acid that forms the thermoplastic polyimide layers are identical to an acid dianhydride monomer and a diamine monomer which constitute a polyamic acid that forms the non-thermoplastic polyimide layer.

9. The method according to claim 6,
wherein:
the thermoplastic polyimide layers of the three-layer coextrusion polyimide film each have a thickness of not less than 2.5 μm and not greater than 10 μm.

10. The method according to claim 6,
wherein:
a/the polyamic acid that forms the non-thermoplastic polyimide layer contains a thermoplastic block component in its molecule.

* * * * *